United States Patent
Newman et al.

(12) 
(10) Patent No.: US 6,809,593 B1
(45) Date of Patent: Oct. 26, 2004

(54) POWER AMPLIFIER DEVICE AND METHOD THEREOF

(75) Inventors: David A. Newman, Tempe, AZ (US); Benjamin R. Gilsdorf, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/424,251

(22) Filed: Apr. 28, 2003

(51) Int. Cl.⁷ ............................................. H03G 3/10
(52) U.S. Cl. ..................................... 330/285; 330/296
(58) Field of Search ............................. 330/285, 296, 330/288, 298, 207 P

(56) References Cited

U.S. PATENT DOCUMENTS

| | | | | |
|---|---|---|---|---|
| 5,497,125 A | * | 3/1996 | Royds | 330/290 |
| 6,396,347 B1 | * | 5/2002 | Lie et al. | 330/285 |
| 6,639,465 B2 | * | 10/2003 | Samelis et al. | 330/129 |

* cited by examiner

*Primary Examiner*—Henry Choe
(74) *Attorney, Agent, or Firm*—Toler, Larson & Abel, LLP

(57) ABSTRACT

A power amplifier's base current is biased by a control circuit that produces a linear relationship across varying temperatures and processes. A voltage to current converter controls a voltage follower configured operational amplifier in response to a reference device to drive the voltage and current of the power amplifier. A slope control circuit is coupled to the reference device to limit a maximum power control slope.

11 Claims, 2 Drawing Sheets

POWER AMPLIFIER DEVICE AND METHOD THEREOF

CO-PENDING APPLICATIONS

This application is related to copending U. S. patent application Ser. No. 10/184,857, filed on Jun. 28, 2002, entitled "Bias Control for HBT Power Amplifiers," naming inventors David A. Newman and Benjamin R. Gilsdorf.

FIELD OF THE INVENTION

This invention relates to power amplifiers and, more specifically, to a device and method for controlling the bias of a power amplifier.

BACKGROUND OF THE INVENTION

Radio Frequency (RF) power amplifiers are used as components in many communication devices, including many wireless communication devices, such as base stations and mobile devices such as cell phones. Hetero-junction bipolar transistor (HBT) power amplifiers are a specific type of power amplifier used for cellular applications due to their high power density and reduction in die size. Unfortunately, biasing these transistors with a constant current poses some difficulty. The voltage supply limitation typical to mobile applications combined with a relatively high Vbe of HBT devices make traditional integrated methods unusable.

FIG. 1 shows a typical diode based biasing control of an HBT transistor. A power amplifier Qpa HBT 100 is biased by a diode configured transistor 110 where the base and collector are shorted together and receive a current through a resistor 120 and supply voltage $V_{REF}$ 130. This configuration requires that a separate voltage $V_{REF}$ 130 (different from the battery voltage $V_{BAT}$ 140 supplied to the collector of the power amplifier 110) be applied to the diode transistor and the biased base of the power amplifier in order to tightly control the biasing current. This configuration leads to several problems for power amplifier applications in mobile communications. Typically, the power amplifier 100 is N times larger than the diode transistor 110 leading to current stealing. Additionally, $R_{REF}$ 120 needs to be large to provide stability over variations in temperature and process, but needs to be small to provide enough current to properly bias the power amplifier, resulting in a circuit that would require a stable reference which supplies a prohibitively large amount of current and is not a viable circuit for power amplifiers in mobile communications applications.

Another solution, shown in FIG. 2, solves the problem of current stealing by using a current mirror with an emitter follower to bias the current supplied to the power amplifier's base. The base of a power amplifier transistor 200 is connected to a base of mirrored transistor 210 and the emitter of a emitter follower transistor 250. The collector of the mirrored transistor 210 is connected to the base of the emitter follower transistor 250 and is connected to a reference voltage 230 through a reference resistor 220 while the collector of the emitter follower transistor 250 is connected to the battery voltage 240 which is also connected to the collector of the power amplifier transistor 200 through some impedance 270. However, this type of circuit is not viable because gallium arsenide (GAS) HBT power amplifiers as now used have Vbe's in the order of 1.4 volts while battery voltage supplies are required to be in the range of 2.7 volts. To control the voltage at the base of the power amplifier, the voltage supply, $V_{REF}$ 230, would need to be greater than is desirable for mobile communication applications and the solution is therefore not viable.

In certain applications, RF power amplifiers are placed within feedback control loops to provide for power control. A measurement of the output RF power delivered by the RF power amplifier vs. the input voltage will often indicate a steep slope condition where the RF power amplifier output changes very rapidly with respect to changes in the input voltage. When an RF power amplifier presents the steep slope condition instability in the power control loop and other undesirable overall RF power amplifier breakdown conditions may result. Thus, it would be desirable to provide an RF power amplifier device that addresses the steep slope condition while maintaining high performance operation.

Accordingly, there is a need for an improved RF power amplifier device and method of operation.

DETAILED DESCRIPTION OF THE PREFERRED EMBODIMENT

Figure 1:
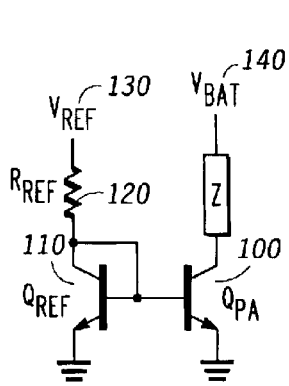
FIG. 1 is a simplified electrical schematic of a prior art HBT diode based biasing circuit.
Figure 2:
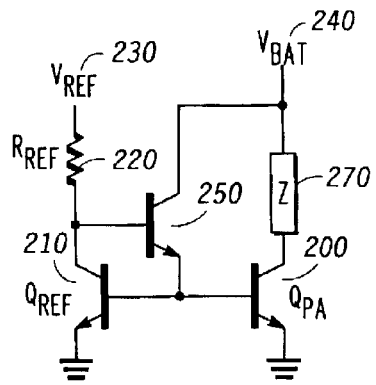
FIG. 2 is a simplified electrical schematic of another prior art HBT biasing circuit.
Figure 3:
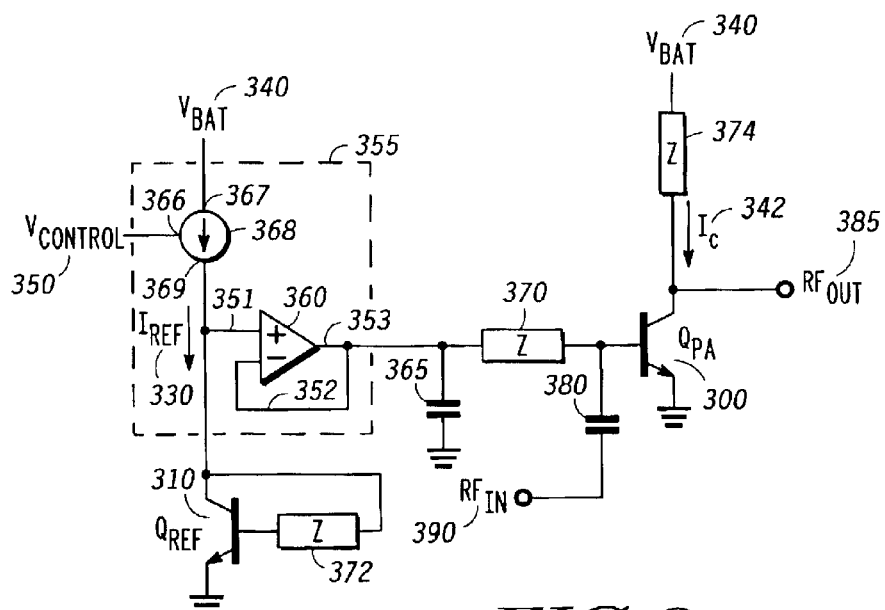
FIG. 3 is a simplified electrical schematic of an HBT power amplifier bias controller according to an embodiment of the invention.

Referring to FIG. 3, one model of an embodiment of a bias control for a hetero-junction bipolar transistor (HBT) power amplifier is shown. Though the circuit was designed for HBT technology, it is not limited to this technology and could be used in technologies such as enhancement mode metal semiconductor field-effect transistors (MESFETS). Similar reference numerals are used throughout the figures to represent similar features when possible.

An HBT power amplifier 300 is biased based on the voltage measured on reference HBT transistor 310 by way of a CMOS chip 355. Although the depiction shows the reference device and power amplifier device to be an HBT transistor, other reference devices and power amplifier devices are contemplated.

The collector of the HBT power amplifier 300 is tapped for an RF output 385 and is supplied voltage from a battery source 340 and some impedance 374 while the emitter is connected to ground. The base of the HBT power amplifier 300 is connected through some impedance 370 to a first input 352 of the operational amplifier 360. The connection of the first input 352 is coupled to ground through a capacitor 365. Additionally, an RF input signal 390 is injected into the base of the HBT power amplifier 300 through some capacitor 380. Although the RF input and output signals are shown, they are not necessary to the discussion of the operation of the bias control of the power amplifier and are shown only for completeness.

The output 353 of the operational amplifier is fed back and connected to the first input 352 of the operational amplifier in order to cause the operational amplifier to function as a voltage follower where the voltage appearing on a second input 351 of the operational amplifier 360 appears some minimal time later on the output 353 of the operational amplifier 360. The second input 351 of the operational amplifier 360 is connected to an output of a voltage-to-current converter 368 as well as to the base through some impedance 372 and to the collector of the reference device 310, in this case another HBT transistor. A control 366 of the voltage-to-current converter is connected to a voltage control signal 350 and the battery supply 340 is used to supply voltage to the voltage-to-current converter 368 through another input 367.

In operation, the present disclosure can use an external CMOS chip and bias control 355, consisting of an operational amplifier 360 and a voltage-to-current converter 368 to bias the HBT power amplifier 300. An analog voltage, $V_{CONTROL}$ 350, adjusts the reference current, $I_{REF}$ 330, through the reference device 310. The $V_{BE}$ of this reference device is measured by the operational amplifier 360 and applied to the base of the HBT power amplifier 300. The HBT power amplifier's collector current $I_C$ 342 reflects the reference current $I_{REF}$ 330 times the ratio of the size difference between the power amplifier 300 and the reference device 310.

This configuration of biasing a power amplifier transistor maintains several advantages over traditional methods. The voltage requirements are only 1 $V_{BE}$ plus the overhead of the current source that typically is only a few hundred millivolts. Also, current through the reference device 310 is significantly less temperature dependent due to the high output impedance of the current source compared to a resistor. Additionally, the reference device 310 can be sourced from the normal battery source operating the power amplifier rather than having to create an independent stable reference. Other advantages are that $I_{REF}$ is not a function of the battery voltage or of process leading to more stabilized control and linearity of the bias control. Additionally, the control voltage Vcontrol can operate the bias as low as Vcontrol=0 volts.

Figure 4:
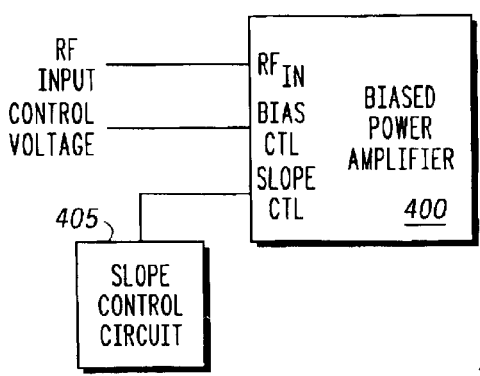
FIG. 4 is a block diagram of a power amplifier according to an embodiment of the disclosure.

FIG. 4 illustrates, in block diagram form a specific embodiment of the present disclosure that illustrates a biased power amplifier module 400, such as that illustrated in FIG. 3, and a slope control circuit 405.

To assure appropriate resolution at their outputs and adequate stability under all conditions, power amplifiers are often specified to have a maximum power control slope. This maximum power control slope is the slope of the transfer function of output power as a function of control voltage. However, the use of power amplifiers with control voltages described herein results in a transfer curve having very steep transfer functions at specific certain control voltages. To decrease the power control slope, a slope smoothing circuit is used in the circuit of FIG. 4 to remove bias current from the biased power amplifier 400. The amount of current that is removed is based on the voltage on the control electrode, e.g., the base-collector node of $Q_{REF}$ 310. The amount of bias current that is removed is roughly proportional to the control voltage until $Q_{REF}$ 310 is turned completely on. After $Q_{REF}$ 310 is turned on, the amount removed is fairly constant. This removal of bias current in this manner results in the power amplifier turning on more slowly, resulting in a smoother power control slope, i.e., a smaller maximum power control slope. This can be better understood with reference to FIGS. 3–7.

Figure 5:
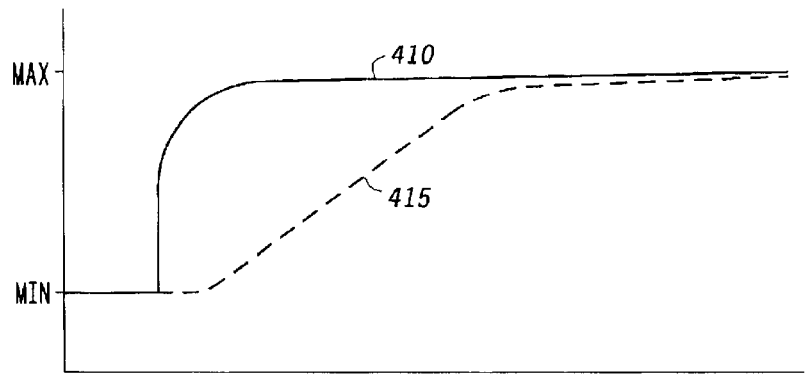
FIG. 5, is a graph illustrating a set of transfer curves.

In operation, a control voltage is applied to the biased power amplifier module 400, at an input labeled BIAS CTL. The biased power amplifier 400 receives an RF INPUT signal, at an input labeled RFIN, that is amplified to produce the signal RF OUTPUT at the output labeled RFOUT. The slope control circuit 405 receives a sink current I from an output of the biased power amplifier module 400 labeled Slope CTL C. The current I affects the output of the power amplifier and bias circuit 400 such that the transfer function from the control voltage to the RF output will be smoother, as compared with the power amplifier and bias circuit without the slope control circuit. For example, Curve 410 of FIG. 5 represents the $V_{CONTROL}$ to power output transfer function of a power amplifier device without the slope smoothing circuitry, while the curve 415 represents the transfer function of a power amplifier device with the slope smoothing circuitry. The transform function observed with the slope smoothing circuitry is a much smoother curve and overall has a slope of approximately one-tenth the magnitude on the illustrated embodiment.

Figure 6:
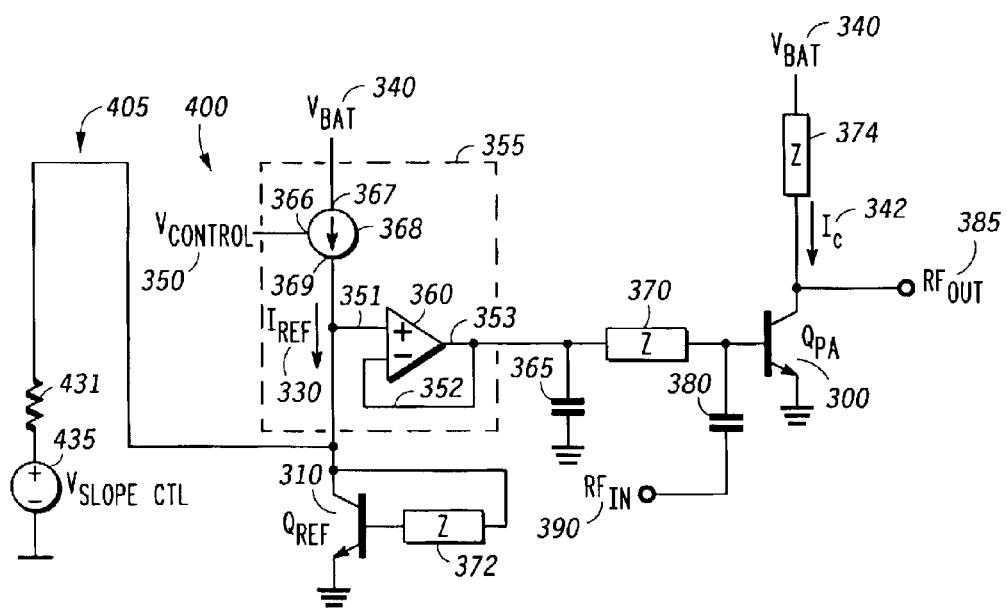
FIGS. 6 and 7 are simplified schematics of a slope control circuits.

FIG. 6 illustrates a specific embodiment of a slope control circuit 405 coupled to the power amplifier of FIG. 3. The slope control circuit of FIG. 6 comprises resistive element 431 coupled in series with a voltage reference source 435, labeled $V_{SLOPE,CTL}$. By selecting the value of $V_{SLOPE,CTL}$ to be less than the threshold voltage, e.g. the reference voltage, of the reference device $Q_{REF}$ 310 a portion of the current supplied by the bias circuit 355 to the conductive element coupled to the collector of $Q_{REF}$ is provided to the resistive element 431. This results in less wired being provided to the reference device $Q_{REF}$. In one embodiment the value of $V_{SLOPE,CTL}$ can be zero (0) volts eliminating the need for the voltage reference source 235. In other words, only a resister 431 is needed in one embodiment.

Figure 7:
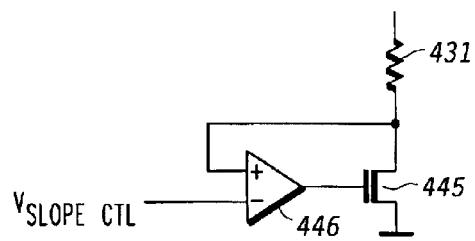

FIG. 7 illustrates another specific embodiment of the slope control circuit of FIG. 6, where the voltage supply device 435 has been implemented using a transistor 445 and an amplifier 446 as the voltage supply 435. Specifically, the transistor 445 has a first current electrode coupled to the resistive element 431, a second current electrode tied to a reference, such as ground, and a control electrode coupled to the first current electrode output of amplifier 446. The amplifier 446 is a differential amplifier having a positive input coupled to the first electrode of the transistor 445, and a negative electrode coupled to the voltage reference source $V_{SLOPE,CTL}$.

While the invention has been particularly shown and described with reference to preferred embodiments thereof, it will be understood by those skilled in the art that the foregoing and other changes in form and details may be made therein without departing from the spirit and scope of the invention. For example, the slope smoothing techniques can be used with various power amplifiers and power transistors.

What is claimed is:

1. A radio frequency power amplifier device comprising:
   a current source to provide a total current;
   a control circuit coupled to the current source, the control circuit responsive to a first portion of the total current;
   a reference device responsive to the control circuit, the reference device having an input responsive to a second portion of the total current and having a reference output; and
   an amplifier responsive to the reference device, the amplifier comprising a control input, a radio frequency input, and a radio frequency output.

2. The radio frequency power amplifier of claim 1, wherein the control input is responsive to the reference output.

3. The radio frequency power amplifier device of claim 1, wherein the RF output is to provide a signal proportional to a signal at the reference output.

4. The radio frequency power amplifier device of claim 1 further comprising a buffer coupled between the reference device and the amplifier.

5. The radio frequency power amplifier device of claim 1, wherein the control circuit is slope control circuit to control a maximum slope of the radio frequency power amplifier.

6. The radio frequency power amplifier device of claim 5, wherein the slope control circuit comprises a resistive element.

7. The radio frequency power amplifier device of claim 6, wherein the slope control circuit comprises a voltage reference.

8. The radio frequency power amplifier device of claim 6, wherein the slope control circuit comprises a transistor.

9. The radio frequency power amplifier device of claim 1, wherein the reference device comprises a current rectifying device.

10. The radio frequency power amplifier device of claim 9, wherein the current rectifying device is a transistor having its control electrode tied to one of its current electrodes.

11. The radio frequency power amplifier device of claim 1, wherein the total current of the current source is responsive to a voltage input.

* * * * *